(12) United States Patent
Perera et al.

(10) Patent No.: US 9,136,360 B1
(45) Date of Patent: Sep. 15, 2015

(54) METHODS AND STRUCTURES FOR CHARGE STORAGE ISOLATION IN SPLIT-GATE MEMORY ARRAYS

(71) Applicants: Asanga H. Perera, West Lake Hills, TX (US); Ko-Min Chang, Austin, TX (US); Craig T. Swift, Austin, TX (US)

(72) Inventors: Asanga H. Perera, West Lake Hills, TX (US); Ko-Min Chang, Austin, TX (US); Craig T. Swift, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/297,657

(22) Filed: Jun. 6, 2014

(51) Int. Cl.
*H01L 29/792* (2006.01)
*H01L 29/66* (2006.01)

(52) U.S. Cl.
CPC ........ *H01L 29/66833* (2013.01); *H01L 29/792* (2013.01)

(58) Field of Classification Search
CPC ................................................ H01L 29/66833
USPC .......................................................... 257/324
See application file for complete search history.

(56) References Cited

U.S. PATENT DOCUMENTS

| 5,350,698 A | 9/1994 | Huang et al. |
| 2013/0234223 A1 | 9/2013 | Toren et al. |

*Primary Examiner* — Anthony Ho (57) ABSTRACT

Forming a memory structure includes forming a charge storage layer over a substrate; forming a first control gate layer; patterning the first control gate layer to form an opening in the first control gate layer and the charge storage layer, wherein the opening extends into the substrate; filling the opening with an insulating material; forming a second control gate layer over the patterned first control gate layer and the insulating material; patterning the second control gate layer to form a first control gate electrode and a second control gate electrode, wherein the first control gate electrode comprises a first portion of each of the first and second control gate layers and the second control gate electrode comprises a second portion of each of the first and second control gate layers, and the insulating material is between the control gate electrodes; and forming select gate electrodes adjacent the control gate electrodes.

18 Claims, 7 Drawing Sheets

METHODS AND STRUCTURES FOR CHARGE STORAGE ISOLATION IN SPLIT-GATE MEMORY ARRAYS

BACKGROUND

Field

This disclosure relates generally to split-gate memory arrays, and more specifically, to methods and structures for charge storage isolation in split-gate memory arrays.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

As the manufacturing processes for memory arrays scale smaller, there exists a greater need for the constituent components of the memory array to scale accordingly. One approach to scaling nonvolatile memory arrays has been to split the select gates and control gates associated with the memory arrays. This may allow, for instance, a memory array manufacturing process in which the height of the array relative to a substrate is reduced.

Memory arrays may store data through the use of a variety of charge storage techniques. In order to scale the size of the memory array, it may be necessary or desirable to likewise scale the components storing charge. One method of storing charge in a compact manner may be through the use of discreet, isolated charge storage areas as opposed to larger, more charge-diffuse methods. Such methods may be collectively referred to as "thin film storage" or "TFS." One example of such a thin film storage is the use of nanocrystals isolated from one another in a charge storage layers, as described in more detail below with reference to claim 1. Although the following figures and example make reference to the use of nanocrystals in one or more charge storage layer(s), other thin film storage techniques may be used without departing from the scope of the present disclosure. For example, nitride thin film storage techniques may be used.

When implementing thin film storage in a memory array, some amount of charge stored within the charge storage layer may migrate over time to portions of the charge storage layer that may be less helpful to an operation of the memory array. For example, with traditional methods of manufacturing nanocrystal memory arrays (e.g., those with a substantially continuous charge storage layer over the array), charge stored within a plurality of nanocrystals associated with a programmed bit may migrate over time to other nanocrystals neighboring the nanocrystals associated with the programmed bit. This may lead to reduced performance of the memory array over time as the ability of the charge storage layer to hold an amount of charge sufficient to perform the operation is reduced. Methods and structures are disclosed herein for addressing this by isolating charge storage regions in split-gate memory arrays, as described in more detail below with reference to FIGS. 1-14.

Figure 1:
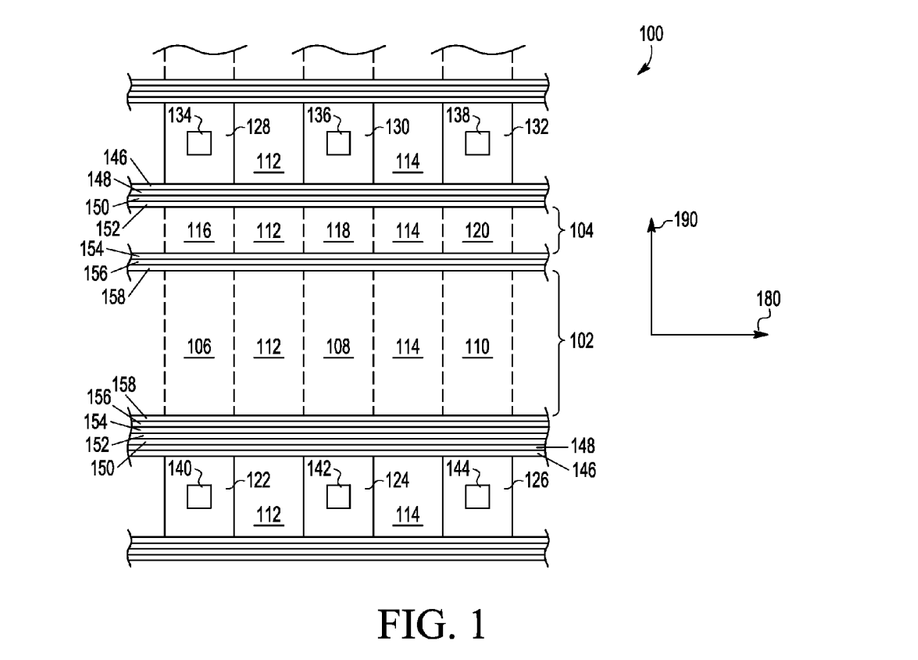
FIG. 1 illustrates an example memory structure for isolating charge storage regions, in accordance with certain embodiments of the present disclosure.

FIG. 1 illustrates an example memory structure 100 for isolating charge storage regions, in accordance with certain embodiments of the present disclosure. In some embodiments, memory structure 100 may include control gate 102, select gate 104 electrically isolated from control gate 102 via one or more layers 154, 156, 158, as described in more detail below with reference to FIGS. 2-14.

In some embodiments, control gate 102 may include a plurality of control gate electrodes 106, 108, 110 isolated from one another via bit line isolation regions 112, 114, as described in more detail below with reference to FIGS. 2-14. In the same or alternative embodiments, select gate 104 may include a plurality of select gate electrodes 116, 118, 120 isolated from one another via bit line isolation regions 112, 114, as described in more detail below with reference to FIGS. 2-14.

In some embodiments, memory structure 100 may include a plurality of source/drain regions 122, 124, 126 electrically isolated from control gate 102 via one or more layers 146, 148, 150, 152, 154, 156, 158, as described in more detail below with reference to FIGS. 2-14. Memory structure 100 may also include a plurality of source/drain regions 128, 130, 132 electrically isolated from select gate 104 via one or more layers 146, 148, 150, 152.

Although three control gate electrodes 106, 108, 110, and three select gate electrodes 116, 118, 120 are illustrated, more, fewer, or different control gate electrodes and/or select gate electrodes may be present in any given configuration of memory structure 100 without departing from the scope of the present disclosure. Likewise, although one set of control gate 102, select gate 104, and source/drain regions 122, 124, 126, 128, 130, 132 are illustrated, more may be present within a given configuration of memory structure 100 without departing from the scope of the present disclosure.

For example, in the portion of memory structure 100 illustrated in FIG. 1, source/drain regions 122, 124, 126 may comprise source regions for a particular bit cell, while source/drain regions 128, 130, 132 may comprise drain regions for the same bit cell. However, in a memory array in which additional bit cells are present along dimension 190 of memory structure, source/drain regions 122, 124, 126, 128, 130, 132 may comprise different types of source/drain regions for different bit cells. In some embodiments, each source/drain region 122, 124, 126, 128, 130, 132 may be electrically coupled to a contact 134, 136, 138, 140, 142, 144.

For the purposes of the illustrated examples of FIGS. 2-14, reference may be made to various dimensions 180, 190 of memory structure 100. Dimensions 180, 190 are intended to aid in illustration and understanding and are not intended to limit the scope of the present disclosure.

In operation, memory structure 100 includes a plurality of control gate electrodes 106, 108, 110 isolated from one another at the charge storage layer, but electrically coupled to one another via a second layer, as described in more detail below with reference to FIGS. 2-14.

Figure 2:
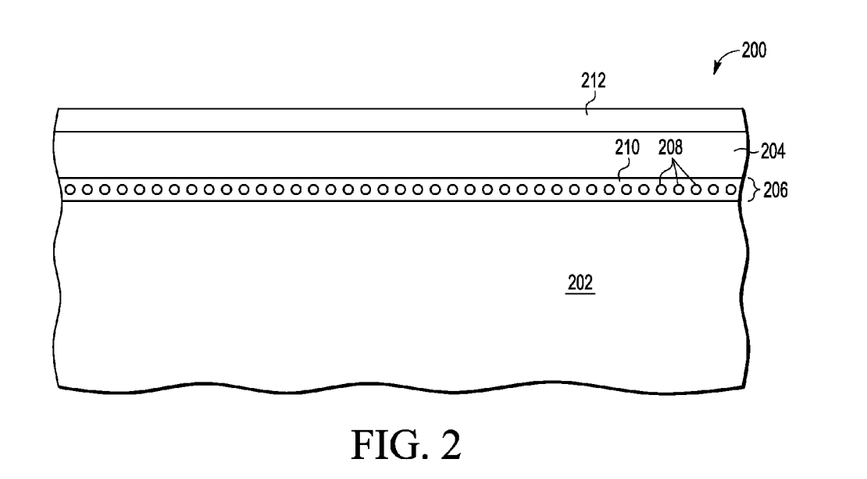
FIG. 2 illustrates an example cross-section of the example memory structure along a first dimension, in accordance with certain embodiments of the present disclosure.

FIG. 2 illustrates an example cross-section 200 of memory structure 100 along a first dimension 180, in accordance with certain embodiments of the present disclosure. Cross-section 200 illustrates certain steps in a manufacturing process of memory structure 100. In some embodiments, cross-section 200 includes substrate 202, charge storage layer 206 layered over substrate 202, first control gate layer 204 layered over charge storage layer 206, and cap layer 212 layered over first control gate layer 204.

Substrate 202 may be any semiconductor material or combinations of materials, such as gallium arsenide, silicon germanium, silicon-on-insulator (SOI), silicon, monocrystalline silicon, the like, and combinations of the above. First control gate layer 204 may be any appropriate layer of relatively conductive material such as polycrystalline silicon.

In some embodiments, charge storage layer 206 may be any appropriate layer including discrete, isolated charge storage elements. For example, charge storage layer 206 formed from a bottom oxide, a plurality of nanocrystals of which nanocrystals 208 are representative, and a top oxide 210 that is between and over the nanocrystals. In some configurations, charge storage layer 206 may be approximately two-hundred angstroms thick, including approximately sixty angstroms for the bottom oxide and approximately one hundred-forty angstroms for the top oxide including nanocrystals. Although example cross-section 200 illustrates nanocrystals 208 within charge storage layer 206, other configurations of charge storage layer 206 may be implemented without departing from the scope of the present disclosure.

Cross-section 200 may also include first control gate layer 204 over charge storage layer 206. First control gate layer 204 may be a layer of polysilicon that may, for example, be deposited at a depth of approximately six hundred angstroms. In some embodiments, first control gate layer 204 may be any appropriate conductive layer of an appropriate conductivity type. For example, first control gate layer 204 may be doped to be N-type polysilicon. In addition to first control gate layer 204, cross-section 200 may also include cap layer 212. Cap layer 212 may be, for example, a deposited layer of nitride. As described in more detail below with reference to FIGS. 3-4, cap layer 212 may be used in order to control a polishing process associated with the manufacture of memory structure 100.

Figure 3:
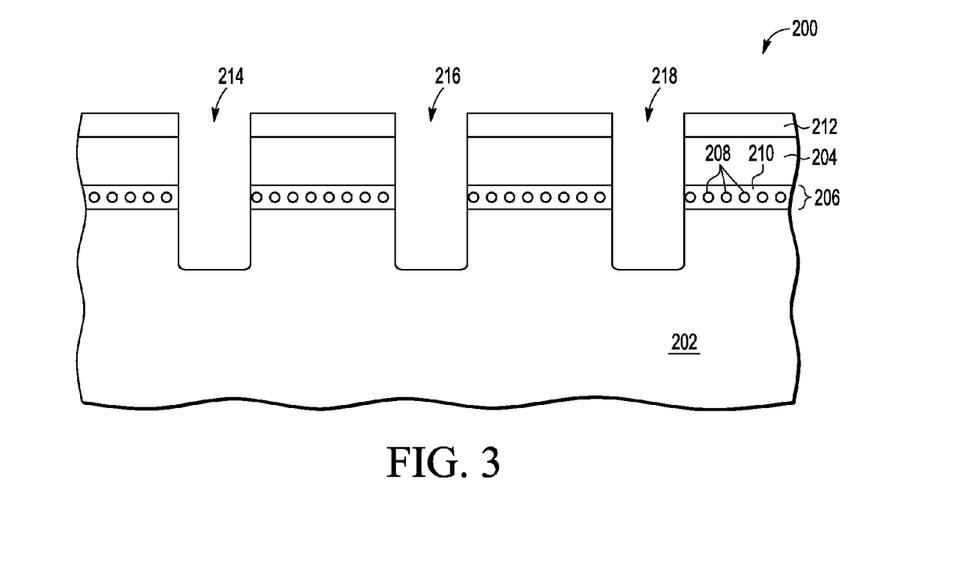
FIG. 3 illustrates an example cross-section along a first dimension of the example memory structure after a patterning and recess process, in accordance with certain embodiments of the present disclosure.

FIG. 3 illustrates an example cross-section 200 of memory structure 100 after a patterning and recess process, in accordance with certain embodiments of the present disclosure. In some embodiments, cross-section 200 may include openings 214, 216, 218 formed in substrate 202, charge storage layer 206, first control gate layer 204, and cap layer 212. Openings 214, 216, 218 may be made at an appropriate depth such that a bottom portion of openings 214, 216, 218 may be within substrate 202 and below charge storage layer 206. In some embodiments, openings 214, 216, 218 may be at a relatively shallow depth (e.g., ~500-700 Å). The depth of a trench formed by openings 214, 216, 218 may be selected according to certain design considerations, including the difficulty in filling openings 214, 216, 218 with additional material (as described in more detail below with reference to FIGS. 4-14) and/or a desired density of memory structure 100.

Figure 4:
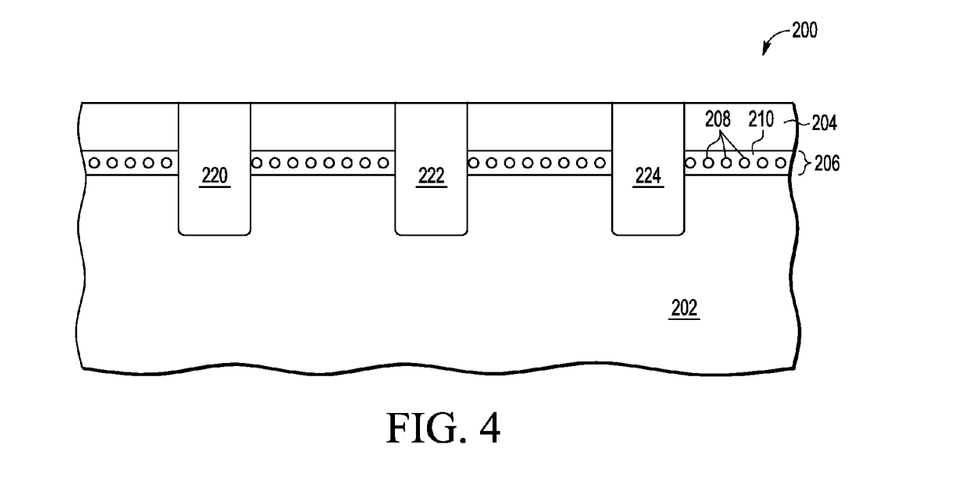
FIG. 4 illustrates an example cross-section along a first dimension of the example memory structure after a deposition and polishing process, in accordance with certain embodiments of the present disclosure.

FIG. 4 illustrates an example cross-section 200 of memory structure 100 after a deposition and polishing process, in accordance with certain embodiments of the present disclosure. In some embodiments, cross-section 200 may include insulating material 220, 222, 224 deposited within openings 214, 216, 218, respectively. In some configurations, the deposition process may include growing (or alternatively, depositing) an oxide liner layer of, for example, one hundred angstroms. Insulating material 220, 222, 224 may then be deposited within openings 214, 216, 218, respectively. Insulating material 220, 222, 224 may be any appropriate insulating material such as an oxide. Memory structure 100 may then be subjected to a polishing process. For example, a chemical-mechanical polishing ("CMP") process may be used in order to polish a portion of a top surface of memory structure. In this example, the CMP process may be responsive to the presence of cap layer 212 such that the CMP process may remove cap layer 212 but leave first control gate layer 204 at substantially the same height as when initially deposited. In the same or alternative embodiments, other deposition, polishing, cleaning, and/or other design and manufacturing processes may be including without departing from the scope of the present disclosure.

Figure 5:
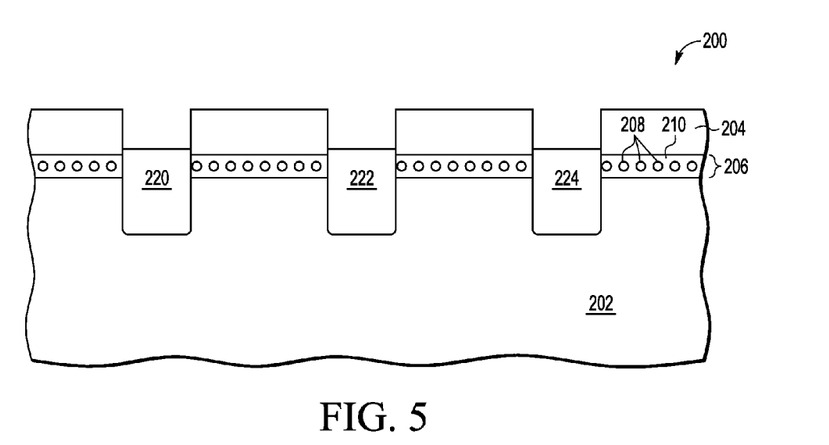
FIG. 5 illustrates an example cross-section along a first dimension of the example memory structure after an etching process, in accordance with certain embodiments of the present disclosure.

FIG. 5 illustrates an example cross-section 200 along a first dimension 180 of memory structure 100 after an etching process, in accordance with certain embodiments of the present disclosure. In some embodiments, insulating material 220, 222, 224 may be etched in such a way as to form a difference in height between insulating material 220, 222, 224 and a top portion of first control gate layer 204. In some embodiments, the etching process may result in the top of insulating material 220, 222, 224 being above a top portion of charge storage layer 206, but below a top portion of first control gate layer 204.

Figure 6:
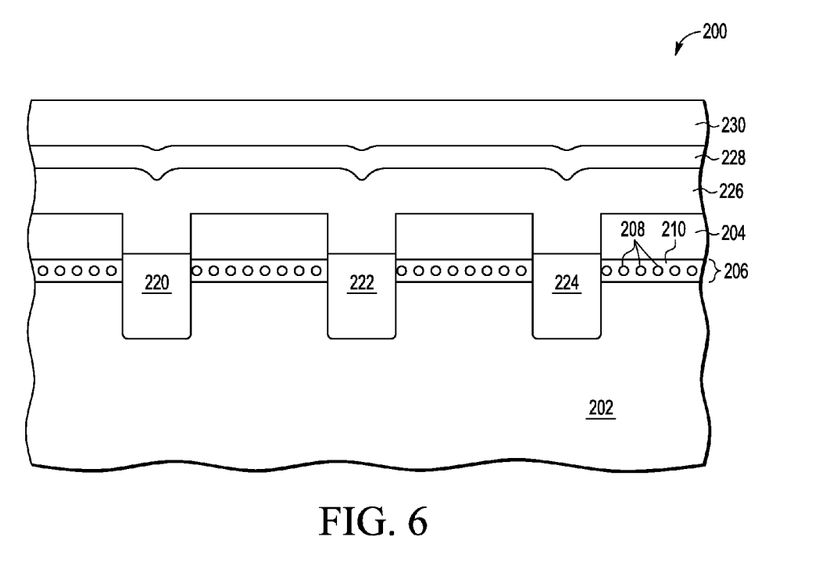
FIG. 6 illustrate example cross-section along a first dimension of the example memory structure after the deposition of second control gate layer, the deposition of cap layer over second control gate layer, and the application of pattern layer over cap layer, in accordance with certain embodiments of the present disclosure.

FIG. 6 illustrate example cross-section 200 along a first dimension 180 of the example memory structure 100 after the deposition of second control gate layer 226, the deposition of cap layer 228 over second control gate layer 226, and the application of pattern layer 230 over cap layer 228, in accordance with certain embodiments of the present disclosure.

In some embodiments, second control gate layer 226 may be a layer of polysilicon deposited at, for example, a depth of approximately 300 angstroms. Second control gate layer 226 may be deposited such that it is in physical contact with the patterned first control gate layer 204. Second control gate layer 226 may be any appropriate conductive layer of an appropriate conductivity type. For example, second control gate layer 226 may be doped to be N-type polysilicon. Further, as described in more detail above with reference to FIGS. 4-5, insulating material 220, 222, 224 may be etched such that there is a difference in height between a top portion of insulating material 220, 222, 224 and a top portion of patterned first control gate layer 204. As a result, and as described in more detail below with reference to FIGS. 7-14, electrical isolation between and among portions of charge storage layer 206 may be formed while also allowing for the formation of a continuous conductive control gate layer.

In some embodiments, cap layer 228 may be an oxide layer deposited over second control gate layer 226 at, for example, a depth of approximately three hundred angstroms. Cap layer 228 may be used in further processing steps, as described in more detail below with reference to FIGS. 7-11. Pattern layer 230 may be applied over cap layer 228 in order to further pattern memory structure 100.

Figure 7:
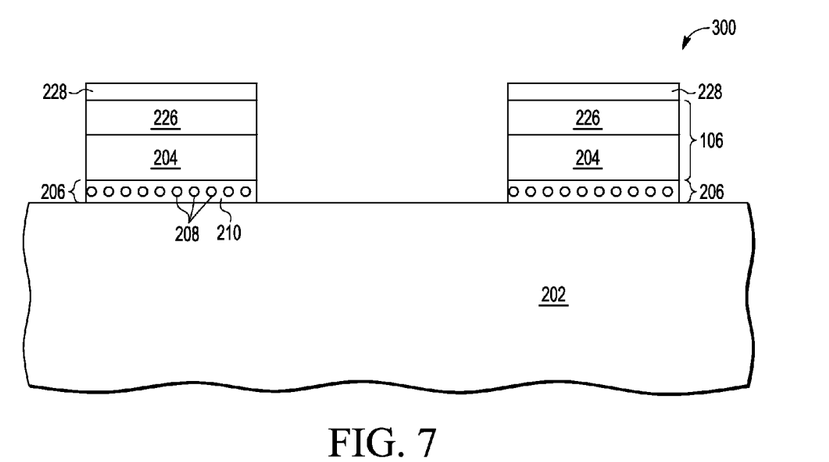
FIG. 7 illustrates an example cross-section of the example memory structure along a second dimension after a patterning process, in accordance with certain embodiments of the present disclosure.

FIG. 7 illustrates an example cross-section 300 of the example memory structure 100 along a second dimension 190 after a patterning process, in accordance with certain embodiments of the present disclosure. FIG. 7 illustrates a portion of a plurality of control gate electrodes (including illustrative control gate electrode 106) aligned along dimension 190, capped by cap layer 228.

Figure 8:
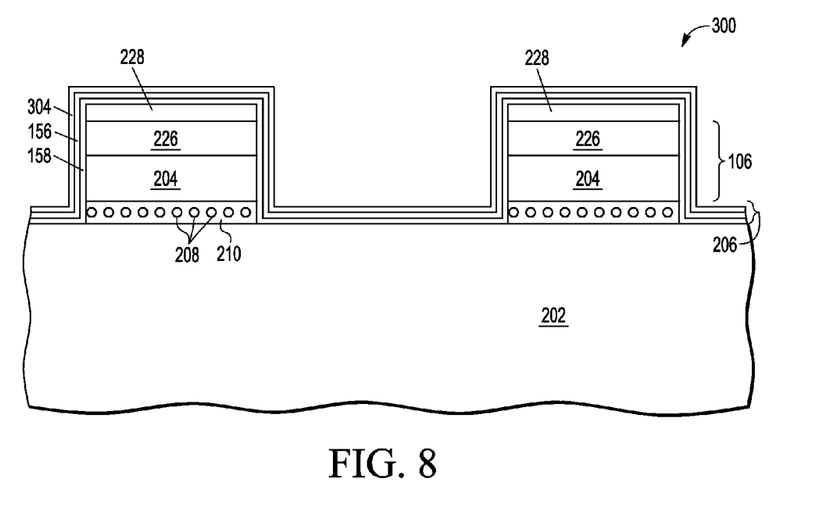
FIG. 8 illustrates an example cross-section along a second dimension of the example memory structure after a plurality of deposition processes, in accordance with certain embodiments of the present disclosure.

FIG. 8 illustrates an example cross-section 300 along a second dimension 190 of the example memory structure 100 after a plurality of deposition processes, in accordance with certain embodiments of the present disclosure. In some embodiments, oxide layer 158 may be deposited over substrate 202, charge storage layer 206, first control gate layer 204, second control gate layer 206, and cap layer 228. Nitride layer 156 may then be deposited over oxide layer 158, and poly layer 304 may be deposited over nitride layer 156. For example, oxide layer 158 may be deposited at a depth of approximately sixty angstroms; nitride layer 156 may be deposited at a depth of approximately twenty angstroms; and poly layer 304 may be deposited at a depth of approximately fifteen angstroms. In some embodiments, layers 156, 158, 304 may act as a spacer providing a specific physical distance from an edge of charge storage layer 206, first control gate layer 204, second control gate layer 226, and cap layer 228, as described in more detail below with reference to FIGS. 9-14.

Figure 9:
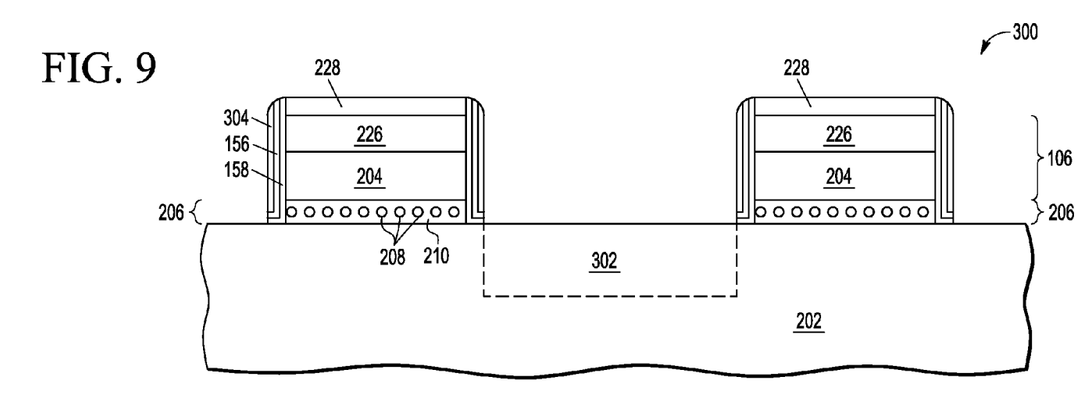
FIG. 9 illustrates an example cross-section along a second dimension of the example memory structure after an etching process and an implantation process, in accordance with certain embodiments of the present disclosure.

FIG. 9 illustrates an example cross-section 300 along a second dimension 190 of the example memory structure 100 after an etching process and an implantation process, in accordance with certain embodiments of the present disclosure. In some embodiments, oxide layer 158, nitride layer 156, and poly layer 304 may be etched from a portion of a top surface of cap layer 228 such that that portion of cap layer 228 may be exposed. Substrate 202 may also undergo an implantation process such that a select gate $V_T$ implant region 302 may be formed between the portions of the plurality of control gate electrodes.

Figure 10:
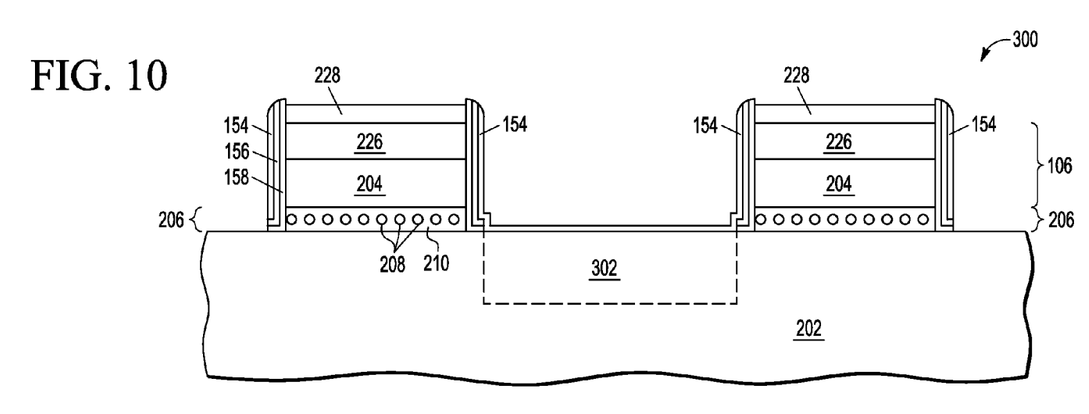
FIG. 10 illustrates an example cross-section along a second dimension of the example memory structure after an oxide growth process, in accordance with certain embodiments of the present disclosure.

FIG. 10 illustrates an example cross-section 300 along a second dimension 190 of the example memory structure 100 after an oxide growth process, in accordance with certain embodiments of the present disclosure. In some embodiments, poly layer 304 may be converted to oxide layer 154, thus forming an oxide-nitride-oxide layer around charge storage layer 206, first control gate layer 204, second control gate layer 226, and/or cap layer 228. For example, oxide layer 154 may be grown to a depth of approximately thirty angstroms. Although a process for growing oxide layer 154 is described, a process depositing oxide layer 154 may also be used without departing from the scope of the present disclosure.

As described in more detail above with reference to FIGS. 8-9, layers 154, 156, 158 may provide a physical space between a control gate electrode and an edge of select gate $V_T$ implant region 302 such that there exists electrical isolation between the edge of select gate $V_T$ implant region 302 and the control gate electrode.

Figure 11:
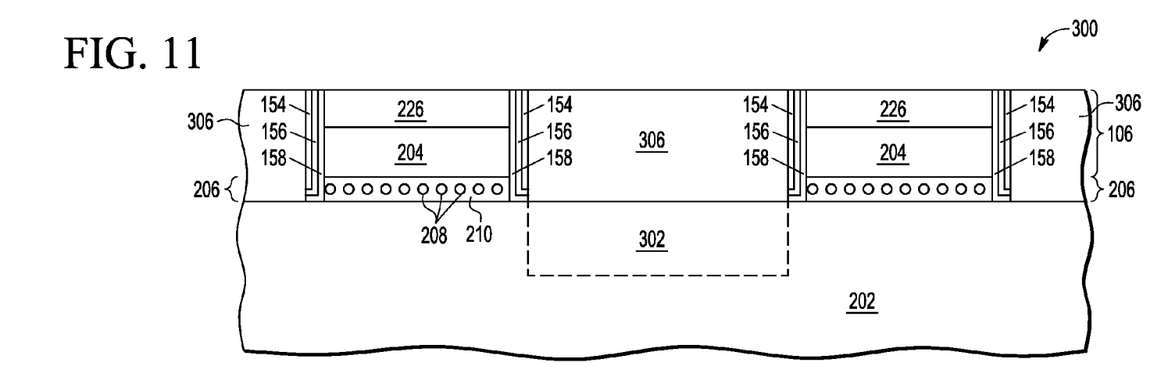
FIG. 11 illustrates an example cross-section along a second dimension of the example memory structure after depositing select gate layer and polishing memory structure, in accordance with certain embodiments of the present disclosure.

FIG. 11 illustrates an example cross-section 300 along a second dimension 190 of the example memory structure 100 after depositing select gate layer 306 and polishing memory structure 100, in accordance with certain embodiments of the present disclosure. In some embodiments, select gate layer 306 may be deposited over substantially all exposed layers of memory structure (e.g., over oxide layer 154, exposed portions of nitride layer 156, exposed portions of oxide layer 158, substrate 202 including select gate $V_T$ implant region 302, and cap layer 228). Select gate layer 306 may be any appropriate conductive layer of an appropriate conductivity type deposited at an appropriate depth. For example, select gate layer 306 may be N-doped polysilicon deposited at a depth of approximately eight hundred angstroms.

Memory structure 100 may then undergo a polishing process. For example, a CMP process may polish a surface of memory structure 100. Such a CMP process may be responsive to the presence of cap layer 228 such that substantially all of cap layer 228 may be removed while leaving substantially all of the deposited second control gate layer 226 intact. The resulting structures may include a plurality of control gate electrodes, including representative control gate electrode 106, as described in more detail below with reference to FIGS. 12-14.

Figure 12:
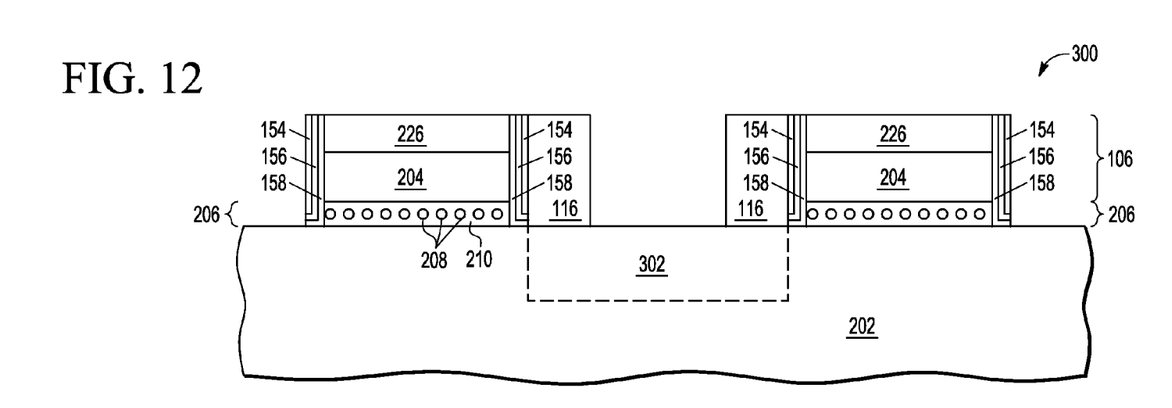
FIG. 12 illustrates an example cross-section along a second dimension of the example memory structure after a patterning process patterning a select gate electrode adjacent to a sidewall of a control gate electrode, in accordance with certain embodiments of the present disclosure.

FIG. 12 illustrates an example cross-section 300 along a second dimension 190 of the example memory structure 100 after a patterning process patterning a select gate electrode (e.g., select gate electrode 116), adjacent to a sidewall of a control gate electrode (e.g., control gate electrode 106), in accordance with certain embodiments of the present disclosure. In some embodiments, the physical distance between select gate electrodes may be any appropriate distance such that source/drain region(s) may be formed between them, as described in more detail below with reference to FIGS. 13-14.

Figure 13:
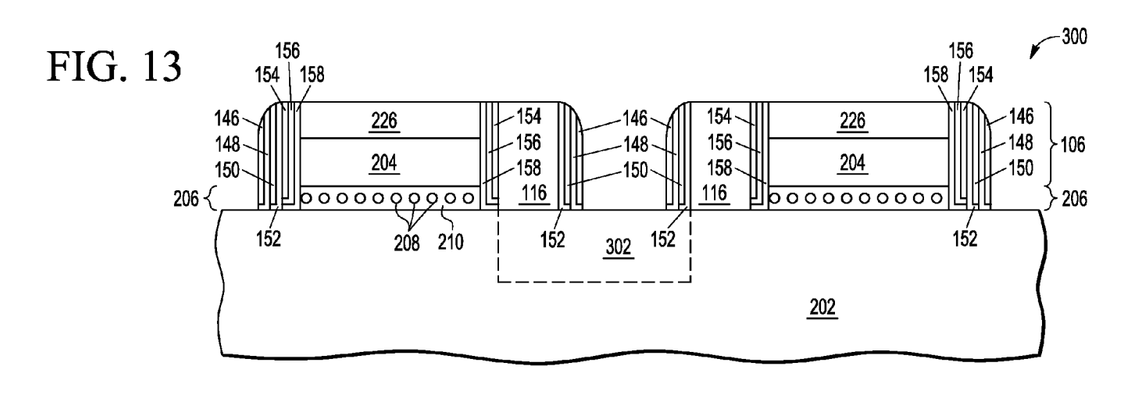
FIG. 13 illustrates an example cross-section along a second dimension of the example memory structure following the formation of a plurality of insulating layers, in accordance with certain embodiments of the present disclosure.

FIG. 13 illustrates an example cross-section 300 along a second dimension 190 of the example memory structure 100 following the formation of a plurality of insulating layers 146, 148, 150, 152, in accordance with certain embodiments of the present disclosure. In some embodiments, a plurality of insulating layers 146, 148, 150, 152 may be formed over an outer portion of a plurality of select gate electrodes, including illustrative select gate electrode 116. As part of a manufacturing process, these insulating layers may also be formed over an exposed portion of a plurality of control gate electrodes (including illustrative control gate electrode 106), as well as exposed portions of layers 154, 156, 158. Layers 146, 148, 150, 152 may then be removed from a top portion of the select gate and control gate electrodes. In some configurations, the deposition and removal may be part of an etching process. In the same or alternative configuration, the deposition and removal may be part of an isotropic spacer process. Still other processes known to one of skill in the art may be used without departing from the scope of the present disclosure.

In some embodiments, more, fewer, or different insulating layers 146, 148, 150, 152. In the example cross-section 300 of FIG. 13, layers 152, 148 may be oxide layers, and layers 150, 146 may be nitride layers. As described in more detail below with reference to FIG. 14, layers 146, 148, 150, 152 may be added at different times in order to accommodate different dimensions associated with the formed source/drain region. For example, layers 152, 150 may be added in order to provide a first spacing dimension from a sidewall of a select gate electrode, while layers 148, 146 may be added at a subsequent time in order to provide a second spacing dimension from the sidewall of the select gate electrode.

Figure 14:
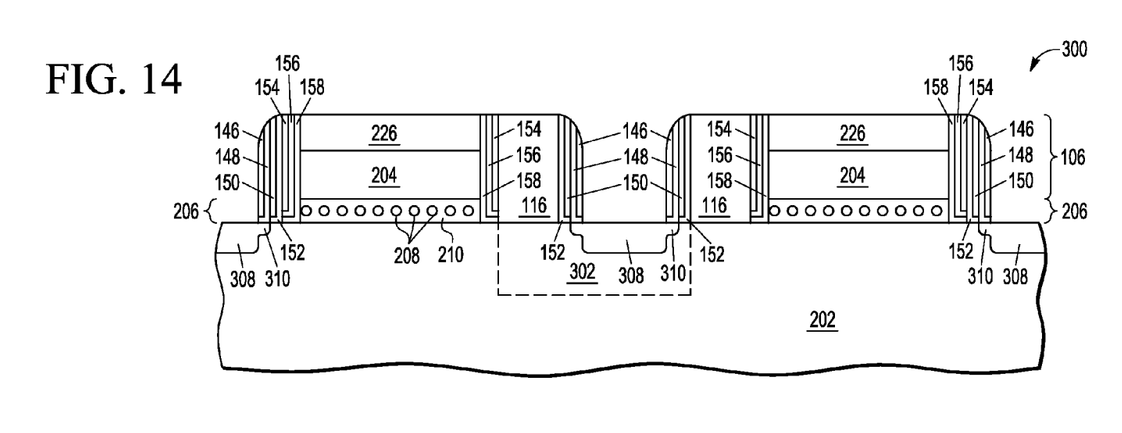
FIG. 14 illustrates an example cross-section along a second dimension of the example memory structure following the formation of source/drain regions, in accordance with certain embodiments of the present disclosure.

FIG. 14 illustrates an example cross-section 300 along a second dimension 190 of the example memory structure 100 following the formation of source/drain regions 308, in accordance with certain embodiments of the present disclosure. In some embodiments, memory structure 100 may include a plurality of source/drain regions 308 between select gate electrodes (including illustrative select gate electrode 116) and between control gate electrodes (including illustrative control gate electrode 106).

In some embodiments, source/drain region 308 may include an extension region 310. Extension region 310 may be an extension to source/drain region 308 at a relatively shallower depth. Extension region 310 may allow for improved performance of memory structure 100. In some embodiments, extension region 310 may be formed within select gate $V_T$ implant region 308 first. For example, extension region 310 may be formed following the deposition of layers 152, 150, as described in more detail above with reference to FIG. 13. In the same or alternative embodiments, source/drain region 308 may then be formed within select gate $V_T$ implant region 308 at a relatively deeper depth. For example, source/drain region 310 may be formed following the deposition of layers 148, 146, as described in more detail above with reference to FIG. 13.

Following the formation of source/drain regions 308, an area such as a silicide may be formed on a surface portion of source/drain regions 308 in order to facilitate electrical contact with a contact such as contacts 132, 134, 136, as illustrated in FIG. 1.

Referring again to FIG. 1, the processes described in more detail above with reference to FIGS. 2-14 may result in an example memory structure such as the one illustrated with reference to FIG. 1. Memory structure 100 may thus include a plurality of control gate electrodes 106, 108, 110 electrically isolated from one another by bit line isolation regions 112, 114. Control gate electrodes 106, 108, 110 may be separated from source regions 122, 124, 126 (e.g., source/drain regions 308) via layers 146, 148, 150, 152, 154, 156, 158. Control gate electrodes 106, 108, 110 may be separated from a corresponding plurality of select gate electrodes 116, 118, 120 via layers 154, 156, 158. Select gate electrodes 116, 118, 120 may be electrically isolated from one another via isolation regions 112, 114. Select gate electrodes 116, 118, 120 may be further separated from drain regions 134, 136, 138 (e.g., source/drain regions 308) via layers 146, 148, 150, 152.

Although three control gate electrodes 106, 108, 110 are illustrated in FIG. 1, more or fewer control gate electrodes may be present without departing from the scope of the present disclosure. Similarly, although three select gate electrodes 116, 118, 120; three drain regions 128, 130, 132; and three source regions 122, 124, 126 are illustrated in FIG. 1, more or fewer of each may be present without departing from the scope of the present disclosure. Further, although only one set of source regions, select gates, control gates, and drain regions are illustrated in FIG. 1, one of skill in the art would understand that example memory structure 100 may be extended along dimension 180 and/or dimension 190 without departing from the scope of the present disclosure.

By now it should be appreciated that there has been provided methods and structures for charge storage isolation in split-gate memory arrays. This may allow for memory structures to scale in a manner that support charge storage layers such that charge migration may be reduced and/or eliminated.

Although the invention is described herein with reference to specific embodiments, various modifications and changes can be made without departing from the scope of the present invention as set forth in the claims below. For example, some of the processing steps described in more detail above with reference to FIGS. 1-14 may be altered and/or eliminated in the service of other design considerations. For example, more, fewer, and/or different isolation layers and/or materials may be used. As an additional example, although certain layers may be referred to as "deposited," "grown," or other formation method, one of skill in the art may identify alternative formation methods without departing from the scope of the present disclosure. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

Forming a memory structure may include forming a charge storage layer (206) over a semiconductor substrate (202); forming a first control gate layer (204) over the charge storage layer; patterning the first control gate layer to form an opening in the first control gate layer and the charge storage layer, wherein the opening extends into the substrate; filling the opening with an insulating material (220); forming a second control gate layer (226) over the patterned first control gate layer and the insulating material, wherein the second control gate layer is in physical contact with the patterned first control gate layer; patterning the second control gate layer to form a first control gate electrode (106) and a second control gate electrode (108), wherein: the first control gate electrode comprises a first portion of each of the first and second control gate layers and the second control gate electrode comprises a second portion of each of the first and second control gate layers, and the insulating material is between the first and second control gate electrodes, forming a first select gate electrode (116) adjacent a sidewall of the first control gate electrode and a second select gate electrode (118) adjacent a sidewall of the second control gate electrode, wherein the insulating material is between the first and second select gate electrodes.

After the filling the opening with the insulating material and prior to the forming the second control gate layer, the forming may also include recessing (FIG. 5) the insulating material with the opening wherein a top surface of the insulting material is between a top surface of the charge storage layer and a top surface of the patterned first control gate layer.

In some embodiments, the charge storage layer may include nanocrystals surrounded by a second insulating material. In the same or alternative embodiments, the opening may be formed such that it runs a length of a bit line of the memory structure.

The method of formation may also include forming a first isolation layer (154, 156, 158) along the sidewall of the first control gate electrode and a second isolation layer (154, 156, 158) along the sidewall of the second control gate electrode. In such a method, forming the first and second select gate electrodes may include forming a select gate layer (306) between the first and second isolation layers; planarizing the select gate layer; and patterning the select gate layer to form the first and second select gate electrodes (116), wherein the first isolation layer may be between the first control gate electrode and the first select gate electrode and the second isolation layer may be between the second control gate electrode and the second select gate electrode. Such a method may further include, as part of forming the first and second select gate electrodes, forming a select gate layer between the first and second isolation layers; and performing an anisotropic etch of the select gate layer to form the first and second select gate electrodes, wherein the first isolation layer may be between the first control gate electrode and the first select gate electrode and the second isolation layer may be between the second control gate electrode and the second select gate electrode.

In some embodiments, patterning the second control gate layer to form the first control gate electrode and the second control gate electrode may be performed such that a first portion of the charge storage layer remains between the first control gate electrode and the substrate and a second portion of the charge storage layer may remain between the second control gate electrode and the substrate, wherein the insulating material may be between the first and second portions of the charge storage layer.

The method of formation may also include forming a sidewall spacer (146-152) adjacent a second sidewall of each of the first and second control gate electrodes and adjacent each of the first and second select gate electrodes.

The method may also include forming source/drain regions (308) in the substrate between the select gate electrodes and adjacent the second sidewalls of the first and second control gate electrodes, wherein the opening may extend further into the substrate than the source/drain regions.

In some embodiments, after patterning the second control gate layer, the second control gate layer may be continuous across the first and second control gate electrodes.

Forming a memory structure may include forming a charge storage layer comprising nanocrystals (206) over a semiconductor substrate (202); forming a first control gate layer (204) over the charge storage layer; patterning the first control gate layer to form a trench in the first control gate layer and the charge storage layer, wherein the trench may extend into the substrate and extends along a length of a bit line of the memory structure; filling the trench with an insulating material (220); forming a second control gate layer (226) directly on the patterned first control gate layer and over the insulating material; patterning the second control gate layer to form a first control gate electrode (106) and a second control gate electrode (108), the trench located between the first and second gate electrodes, wherein: each of the first and second control gate electrodes may include a separate portion of the first control gate layer, and the second control gate layer may be continuous between the first and second control gate electrodes; and forming a first select gate electrode (116) adjacent a sidewall of the first control gate electrode and a second select gate electrode (118) adjacent a sidewall of the second control gate electrode, wherein the insulating material may be between the first and second select gate electrodes.

In such a method, after the filling the trench with the insulating material and prior to the forming the second control gate layer, the method may also include recessing the insulating material with the trench wherein a top surface of the insulting material is between a top surface of the charge storage layer and a top surface of the patterned first control gate layer. Further, the method may include forming a first isolation layer along the sidewall of the first control gate electrode and a second isolation layer along the sidewall of the second control gate electrode.

Still further, the method may include, when forming the first and second select gate electrodes, forming a select gate layer between the first and second isolation layers; planarizing the select gate layer; and patterning the select gate layer to form the first and second select gate electrodes, wherein the first isolation layer is between the first control gate electrode and the first select gate electrode and the second isolation layer is between the second control gate electrode and the second select gate electrode.

Still further, when forming the first and second select gate electrodes, the method may include forming a select gate layer between the first and second isolation layers; and performing an anisotropic etch of the select gate layer to form the first and second select gate electrodes, wherein the first isolation layer is between the first control gate electrode and the first select gate electrode and the second isolation layer is between the second control gate electrode and the second select gate electrode.

In some embodiments, such a method may include, when patterning the second control gate layer to form the first control gate electrode and the second control gate electrode, a first portion of the charge storage layer between the first control gate electrode and the substrate and a second portion of the charge storage layer between the second control gate electrode and the substrate, wherein the insulating material may be between the first and second portions of the charge storage layer.

In the same or alternative embodiments, the method may also include forming source/drain regions in the substrate between the select gate electrodes, and adjacent each of the first sidewall spacers, wherein the trench extends further into the substrate than the source/drain regions.

A memory structure may include a plurality of split gate device memory cells over a semiconductor substrate, wherein each memory cell includes a charge storage layer; a first control gate layer; a second control gate layer directly on the first control gate layer, wherein the charge storage layer and first control gate layer is physically separate from any adjacent split gate device memory cells, and the second control gate layer is continuous with an adjacent split gate device memory cell; and a select gate adjacent a sidewall of the first and second control gate layers; and a trench in the substrate at least partially filled with an insulating material, wherein the trench is located between adjacent columns of split gate device memory cells. In some embodiments, a top surface of the insulating material may be devoid of nanocrystals.

What is claimed is:
1. A method for forming a memory structure, the method comprising:
forming a charge storage layer over a semiconductor substrate;

forming a first control gate layer over the charge storage layer;

patterning the first control gate layer to form an opening in the first control gate layer and the charge storage layer, wherein the opening extends into the substrate;

filling the opening with an insulating material;

forming a second control gate layer over the patterned first control gate layer and the insulating material, wherein the second control gate layer is in physical contact with the patterned first control gate layer;

patterning the second control gate layer to form a first control gate electrode and a second control gate electrode, wherein:

the first control gate electrode comprises a first portion of each of the first and second control gate layers and the second control gate electrode comprises a second portion of each of the first and second control gate layers, and the insulating material is between the first and second control gate electrodes, forming a first select gate electrode adjacent a sidewall of the first control gate electrode and a second select gate electrode adjacent a sidewall of the second control gate electrode, wherein the insulating material is between the first and second select gate electrodes.

2. The method of claim 1, further comprising:

after the filling the opening with the insulating material and prior to the forming the second control gate layer, recessing the insulating material with the opening wherein a top surface of the insulting material is between a top surface of the charge storage layer and a top surface of the patterned first control gate layer.

3. The method of claim 1, wherein the charge storage layer comprises nanocrystals surrounded by a second insulating material.

4. The method of claim 1, further comprising:

forming a first isolation layer along the sidewall of the first control gate electrode and a second isolation layer along the sidewall of the second control gate electrode.

5. The method of claim 4, wherein the forming the first and second select gate electrodes comprises:

forming a select gate layer between the first and second isolation layers;

planarizing the select gate layer; and patterning the select gate layer to form the first and second select gate electrodes, wherein the first isolation layer is between the first control gate electrode and the first select gate electrode and the second isolation layer is between the second control gate electrode and the second select gate electrode.

6. The method of claim 4, wherein the forming the first and second select gate electrodes comprises:

forming a select gate layer between the first and second isolation layers; and performing an anisotropic etch of the select gate layer to form the first and second select gate electrodes, wherein the first isolation layer is between the first control gate electrode and the first select gate electrode and the second isolation layer is between the second control gate electrode and the second select gate electrode.

7. The method of claim 1, wherein the patterning the second control gate layer to form the first control gate electrode and the second control gate electrode is performed such that a first portion of the charge storage layer remains between the first control gate electrode and the substrate and a second portion of the charge storage layer remains between the second control gate electrode and the substrate, wherein the insulating material is between the first and second portions of the charge storage layer.

8. The method of claim 1, further comprising:

forming a sidewall spacer adjacent a second sidewall of each of the first and second control gate electrodes and adjacent each of the first and second select gate electrodes.

9. The method of claim 1, wherein the opening is formed such that it runs a length of a bit line of the memory structure.

10. The method of claim 1, further comprising:

forming source/drain regions in the substrate between the select gate electrodes and adjacent the second sidewalls of the first and second control gate electrodes, wherein the opening extends further into the substrate than the source/drain regions.

11. The method of claim 1, wherein, after the patterning the second control gate layer, the second control gate layer is continuous across the first and second control gate electrodes.

12. A method for forming a memory structure, the method comprising:

forming a charge storage layer comprising nanocrystals over a semiconductor substrate;

forming a first control gate layer over the charge storage layer;

patterning the first control gate layer to form a trench in the first control gate layer and the charge storage layer, wherein the trench extends into the substrate and extends along a length of a bit line of the memory structure;

filling the trench with an insulating material;

forming a second control gate layer directly on the patterned first control gate layer and over the insulating material;

patterning the second control gate layer to form a first control gate electrode and a second control gate electrode, the trench located between the first and second gate electrodes, wherein:

each of the first and second control gate electrodes comprises a separate portion of the first control gate layer, and the second control gate layer is continuous between the first and second control gate electrodes; and forming a first select gate electrode adjacent a sidewall of the first control gate electrode and a second select gate electrode adjacent a sidewall of the second control gate electrode, wherein the insulating material is between the first and second select gate electrodes.

13. The method of claim 12, further comprising:

after the filling the trench with the insulating material and prior to the forming the second control gate layer, recessing the insulating material with the trench wherein a top surface of the insulting material is between a top surface of the charge storage layer and a top surface of the patterned first control gate layer.

14. The method of claim 12, further comprising:

forming a first isolation layer along the sidewall of the first control gate electrode and a second isolation layer along the sidewall of the second control gate electrode.

15. The method of claim 14, wherein the forming the first and second select gate electrodes comprises:

forming a select gate layer between the first and second isolation layers;

planarizing the select gate layer; and patterning the select gate layer to form the first and second select gate electrodes, wherein the first isolation layer is between the first control gate electrode and the first select gate electrode and the second isolation layer is between the second control gate electrode and the second select gate electrode.

16. The method of claim 14, wherein the forming the first and second select gate electrodes comprises:
   forming a select gate layer between the first and second isolation layers; and
   performing an anisotropic etch of the select gate layer to form the first and second select gate electrodes, wherein the first isolation layer is between the first control gate electrode and the first select gate electrode and the second isolation layer is between the second control gate electrode and the second select gate electrode.

17. The method of claim 12, wherein the patterning the second control gate layer to form the first control gate electrode and the second control gate electrode is performed such that a first portion of the charge storage layer remains between the first control gate electrode and the substrate and a second portion of the charge storage layer remains between the second control gate electrode and the substrate, wherein the insulating material is between the first and second portions of the charge storage layer.

18. The method of claim 12, further comprising:
   forming source/drain regions in the substrate between the select gate electrodes, and adjacent each of the first sidewall spacers, wherein the trench extends further into the substrate than the source/drain regions.

* * * * *